United States Patent
Bergstedt et al.

(10) Patent No.: US 6,395,378 B2
(45) Date of Patent: May 28, 2002

(54) PCB AND METHOD FOR MAKING PCB WITH THIN COPPER LAYER

(75) Inventors: Leif Bergstedt, Sjömarken; Per Ligander, Göteborg, both of (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/753,653

(22) Filed: Jan. 4, 2001

(30) Foreign Application Priority Data

Jan. 14, 2000 (SE) ................................. 0000097

(51) Int. Cl.$^7$ ................................. B32B 3/00
(52) U.S. Cl. .................. 428/209; 428/901; 174/250; 174/266
(58) Field of Search ................. 428/209, 901; 174/250, 254, 266

(56) References Cited

U.S. PATENT DOCUMENTS

| | | | |
|---|---|---|---|
| 3,902,951 A | | 9/1975 | Doi et al. |
| 4,581,301 A | | 4/1986 | Michaelson |
| 4,735,676 A | | 4/1988 | Iwasa |
| 4,751,146 A | * | 6/1988 | Maeda et al. ................ 428/461 |
| 5,073,456 A | * | 12/1991 | Palladino .................... 428/446 |
| 5,686,172 A | * | 11/1997 | Ohya et al. ................... 428/210 |
| 5,799,393 A | | 9/1998 | Backasch et al. |
| 5,965,245 A | * | 10/1999 | Okano et al. ................ 428/209 |
| 6,133,377 A | * | 10/2000 | Nakamura et al. .......... 428/416 |
| 6,197,425 B1 | * | 3/2001 | Sekimoto et al. ............ 428/416 |
| 6,230,401 B1 | * | 5/2001 | Ligander et al. ............. 174/254 |
| 6,242,078 B1 | * | 6/2001 | Pommer et al. ............. 428/209 |

FOREIGN PATENT DOCUMENTS

| | | |
|---|---|---|
| EP | 0 238 118 A2 | 9/1987 |
| EP | 0 457 180 A2 | 11/1991 |
| EP | 0 591 887 A2 | 4/1994 |
| EP | 0 675 435 A1 | 10/1995 |
| WO | 98/20542 | 5/1998 |
| WO | 99/57949 | 11/1999 |

OTHER PUBLICATIONS

Patent Abstracts of Japan, 09246729 A, Sep. 19, 1997, application No. 08051477, filed Mar. 8, 1996.

* cited by examiner

*Primary Examiner*—Cathy Lam
(74) *Attorney, Agent, or Firm*—Nixon & Vanderhye P.C.

(57) ABSTRACT

The invention concerns a PC board with laminates for electrical circuits, the PC board comprising at least one carrier (1) and at least one copper surface layer (7), intended to, after the removal of selected parts, e.g. by etching, function as conductors on the PC board. The new thing is that the carrier at least at some parts has a surface roughness of up to mainly the same size as the thickness of the copper layer and that at least at the above named rough parts is arranged a surface levelling layer (5a,b) between the carrier (1) and the copper layer (7). Further, the invention concerns a method for producing PC board laminate for electrical circuits as above, the laminate comprising a copper layer and a carrier that has a surface roughness of mainly the same size as the thickness of the copper layer. The new thing here is that a layer (5a,b) of liquid epoxy is applied on the one or those surface parts of the carrier which in the end are to carry a copper layer, that the epoxy layer is dried and hardened, and that copper layers (7) are plated on the epoxy layers (5a,b).

6 Claims, 1 Drawing Sheet

PCB AND METHOD FOR MAKING PCB WITH THIN COPPER LAYER

TECHNICAL FIELD

The present invention relates to a printed circuit board made of laminate for electric circuits, comprising at least one carrier layer and at least one surface layer made of copper intended, after the removal of selected portions, for example by etching, to constitute the conductors on the board. The invention also relates to a method for producing printed circuit board laminate of the abovementioned type intended for electric circuits.

BACKGROUND ART

Circuit boards with conductors consisting of a copper layer etched into a pattern located on one or both sides of the board or even inside the board are commonly used within the field of electronics. These boards often have a base layer consisting of glass fibre mixed with epoxy. The glass content in these mixtures can vary, but common values are 40–60%. One problem, especially with an advanced degree of miniaturization, is thermal expansion which can result in breakage and contact difficulties. Another problem is surface roughness. If the quantity of glass is increased, the thermal expansion coefficient decreases, but a disadvantage of this is that the surface of the laminate becomes coarser. A secondary consequence of the surface becoming coarser, that is to say being imparted an inferior surface finish, is that, when copper plating is applied, it is not possible to have too thin a copper layer because the conductor pattern is jeopardized by the coarse surface. On the other hand, with a thicker copper layer, it must be borne in mind that etching has to continue until those portions which are to be removed are completely etched through and removed, which means that the pattern cannot be made too fine-meshed because the etching becomes more uneven at the edges as the etching time increases and the risk of defects then increases. There are circuit boards which have a low thermal expansion coefficient but these are in most cases based on cores of metal or ceramics and are relatively expensive.

DISCLOSURE OF INVENTION

By means of the present invention, a circuit board has been produced, in which the material makes it possible for the linear expansion due to temperature increases to be reduced considerably, but in which it is still possible to have relatively thin copper layers and thus a fine-meshed pattern with conductor widths as small as 50 µm. The board is still inexpensive in comparison with, for example, the variants with the metal cores. To this end, the invention is characterized in that the carrier layer has, at least in certain portions, been allowed to have a surface roughness of up to essentially the same size as the thickness of the copper layer, and in that, at least in the abovementioned portions, a surface-levelling plane layer is arranged between the carrier layer and the copper layer. The plane layer suitably consists of epoxy and has a thickness which is essentially the same size as the surface roughness of the carrier layer, that is to say is essentially the same thickness as the surface roughness of the carrier layer. In this connection, a carrier layer which contains glass fibre and epoxy can advantageously be used, and good linear expansion properties are achieved if the glass fibre content exceeds 70%.

The epoxy layer levels the surface of the coarse carrier layer and increases the adhesion between the copper and the glass fibre, so that a thinner copper layer can be used on the surface thus smoothed, which in turn results in shorter etching time and less unevenness at the edges of the etching, with the possibility of narrow conductors.

The new method is characterized in that a layer of liquid epoxy is applied to that surface or those surfaces of the carrier layer which has or have a surface roughness of the same order of size as the thickness of the copper layer envisaged and which in the end is or are to carry a copper layer, in that the epoxy layers are dried and hardened, and in that copper layers are plated on top of the epoxy layers.

In the case of those laminates which are to have through-plated holes, it is an advantage if these holes are drilled after application of epoxy but before the copper-plating because it is then possible to obtain a homogeneous copper thickness.

BRIEF DESCRIPTION OF DRAWINGS

The invention will be described and explained in greater detail below with reference to the figures shown in the appended drawing, in which.

MODE FOR CARRYING OUT THE INVENTION

Figure 1:
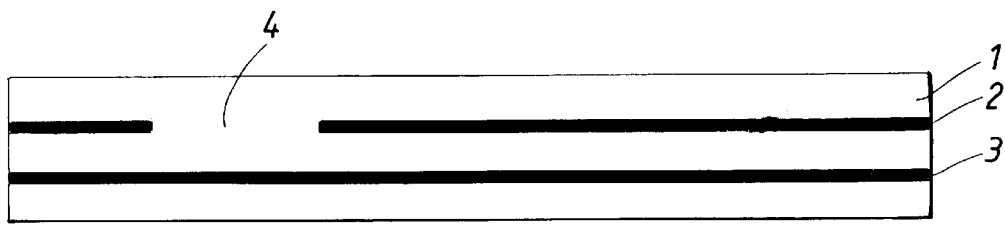
FIG. 1 shows in cross section a part of a circuit board laminate of what is known as the multilayer type without surface material applied.
Figure 2:
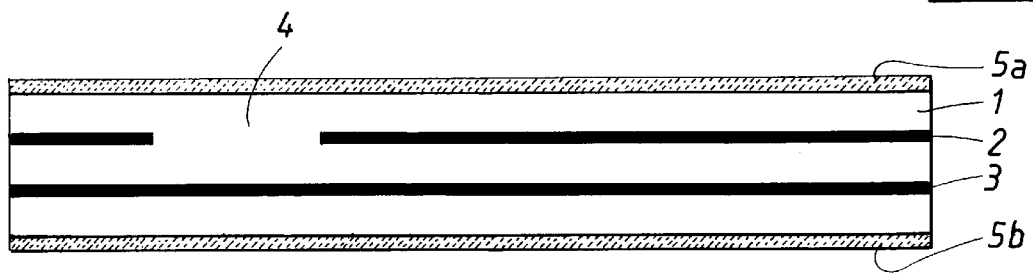
FIG. 2 shows the laminate from FIG. 1 with epoxy layers applied.
Figure 3:
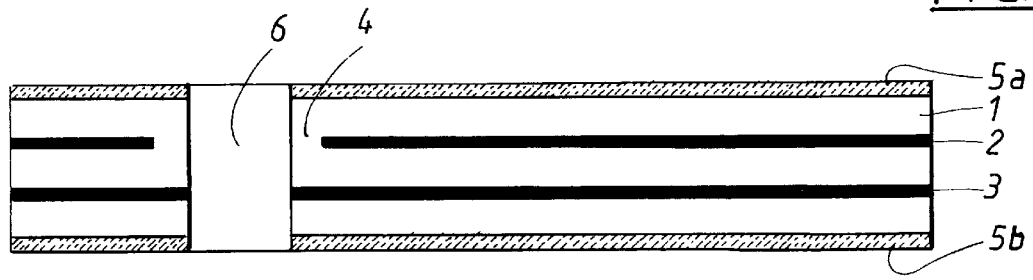
FIG. 3 shows the laminate with a drilled hole.

With reference to FIG. 1, the invention includes a laminate 1 made of glass fibre-filled epoxy. Included in the glass fibre laminate are two inner conductor layers 2 and 3. The conductor layer 2 is provided with an insulating hole 4 for subsequent drilling through without contact. The percentage of glass fibre/epoxy in the glass fibre layer is suitably 75/25, but glass contents as low as 70% are possible. With this high glass fibre content, a linear expansion coefficient as low as 9–10 ppm/° C. is achieved, which is to be compared with the more usual 16–18 ppm for conventionally used circuit board laminates with glass fibre contents of 40–60%. A low linear expansion coefficient is desirable when the copper layer is thin, down towards 18–20 µm, which is in turn the case when it is necessary to etch narrow conductors on account of an advanced degree of miniaturization. It is well known that etching narrow conductors requires a thin copper layer. However, with the abovementioned glass contents, the surface becomes considerably coarser, compared with the conventional laminates, and it is therefore not possible for the desired thickness of copper layer to be applied without encountering problems associated with reliable subsequent pattern-etching in the copper. In order to overcome these problems, according to the invention, a layer 5 of liquid epoxy is applied, as shown in FIG. 2, which is suitably roughly 5–15 µm thick, depending on the surface roughness of the carrier layer, and is dried and hardened. The epoxy can be applied by, for example, rolling, spraying, screening or curtain-coating. The epoxy layer spreads and forms a plane surface outside the uneven surface of the carrier layer, the surface roughness of which, with glass fibre contents of this type, can usually be up to $R_A \pm 10$ µm, and is moreover an excellent base with very good adhesion to the copper. In the figure, the "coarse" surface of the carrier layer is not visible because the surface roughness is exceedingly small in relation to the thickness of the carrier layer 1, while the thickness of the surface-levelling plane layer of epoxy has been greatly exaggerated in order that the layer be included in the figure. As the surface roughness, with glass contents such as these, is up to an $R_A$ number of $\pm 10\,\mu m$, the thickness of the epoxy layer 5 should therefore be roughly 20 $\mu m$ in this case. The plane layer of epoxy should not be thicker so as to avoid undesirable effects such as thermal expansion, although the value is not critical. If the circuit board has a double-sided pattern, epoxy is applied to both sides 5a and 5b. After this, it would be possible to plate the board so as to obtain an etchable copper layer, but, if the board is to have through-plated holes for transferring contact between the different conductor pattern layers of the board, it is advantageous to drill the holes to be plated before the copper-plating is carried out, because a further plating of the holes afterwards would result in a copper layer of essentially twice the thickness on the surface, which is unnecessary and of course what, inter alia, is to be avoided. FIG. 3 shows how a hole 6 has been drilled through the board in the centre of the insulating hole 4, the drilled hole having a smaller diameter than the insulating hole so that contact cannot be made with the plating to be applied, while the drilled hole penetrates the layer 3 which is to be in contact with the hole plating.

Figure 4:
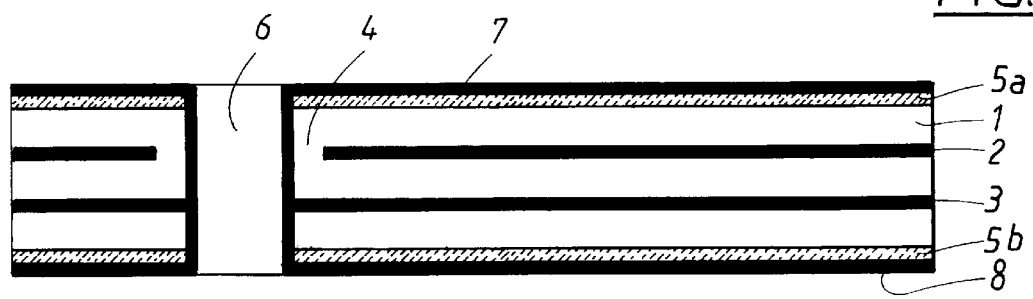
FIG. 4 shows the laminate with copper plating applied.

When the holes which are to be through-plated have been drilled, the board can be plated, for example by panel plating, double-sided if desired, the plating having, as shown in FIG. 4, the same thickness in the hole 6 as on the surfaces 7 and 8. The thickness of the copper layer can in this connection be selected to be roughly 18–20 $\mu m$.

Figure 5:
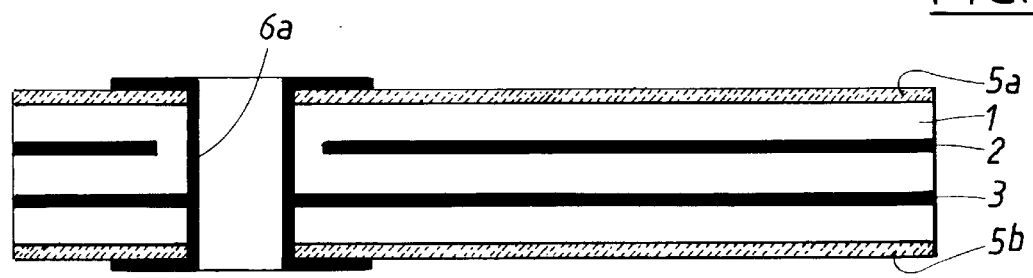
FIG. 5 shows the laminate after etching has been carried out.

After this, the pattern is laid out and the board is etched in a known manner, and FIG. 5 shows how the area closest to the drilled hole has been etched away and the hole 6 has been left with a plating 6a to be soldered or to be connected to a conductor which may run at right angles to the plane of the paper.

The invention is not limited to the exemplary embodiment shown in the drawings and explained in the description, but various modifications and variants are possible within the scope of the patent claims below. For example, the board does not have to be a multilayer board, but the invention can be applied to boards with a pattern on both sides or on only one side. It is of course also possible to apply the invention to laminates with carrier layers of a type other than glass fibre, for example ceramics, and the advantage is then that the surface roughness can be allowed to have values which are not usually permitted in the case of ceramic-based circuits. It is of course also possible to coat only certain portions of the carrier layer with the plane layer, namely those portions where either the surface roughness is greatest or the conductor width after etching is critically small.

What is claimed is:
1. Printed circuit board for electric circuits, comprising:
   at least one carrier layer,
   at least one surface layer comprising copper which after removal of selected portions thereof constitutes conductors on the board,
   wherein a surface roughness of the carrier layer has peaks and valleys wherein certain of the peaks are of a height of up to at least a thickness of the surface layer comprising copper, and
   a surface-leveling plane layer is arranged between the carrier layer and the copper layer, wherein the surface-leveling plane layer comprises an epoxy deposited in a liquid phase which later solidifies in order to cover the peaks of the carrier layer.
2. Printed circuit board according to claim 1 wherein the plane layer has a thickness which is approximately the same size as the height of certain peaks of the carrier layer.
3. Printed circuit board according to claim 1 wherein the carrier layer comprises glass fibre and epoxy, and in that the glass fibre content of the carrier layer exceeds 70%.
4. Method for producing a printed circuit board according to claim 1 wherein a layer of liquid epoxy is applied to that surface or those surfaces of the carrier layer which in the end is or are to carry a copper layer, in that the epoxy layers are dried and hardened to form the surface leveling plane layer, and wherein copper layers are plated on top of the epoxy layer(s).
5. Method for producing printed circuit board laminate according to claim 4, characterized in that through-holes, which are to be through-plated, are drilled after the epoxy layers have been applied but before the copper layers are plated, so that the holes can be plated at the same time as the surface layers.
6. Printed circuit board for electric circuits, comprising:
   at least one carrier layer,
   at least one surface layer comprising copper which after removal of selected portions thereof constitutes conductors on the board,
   wherein a surface roughness of the carrier layer has peaks and valleys wherein certain of the peaks are of a height of up to at least a thickness of the surface layer comprising copper layer,
   a surface-leveling plane layer is arranged between the carrier layer and the copper layer, and
   wherein the carrier layer has a surface roughness with an $R_A$ of up to $\pm 10\,\mu m$.

* * * * *